US008592986B2

(12) United States Patent
Otsuka et al.

(10) Patent No.: US 8,592,986 B2
(45) Date of Patent: Nov. 26, 2013

(54) HIGH MELTING POINT SOLDERING LAYER ALLOYED BY TRANSIENT LIQUID PHASE AND FABRICATION METHOD FOR THE SAME, AND SEMICONDUCTOR DEVICE

(75) Inventors: Takukazu Otsuka, Kyoto (JP); Keiji Okumura, Kyoto (JP); Brian Lynn Rowden, Springdale, AR (US)

(73) Assignees: Rohm Co., Ltd. (JP); The Board of Trustees of the University of Arkansas, Little Rock, AR (US)

( * ) Notice: Subject to any disclaimer, the term of this patent is extended or adjusted under 35 U.S.C. 154(b) by 126 days.

(21) Appl. No.: 12/942,437

(22) Filed: Nov. 9, 2010

(65) Prior Publication Data

US 2012/0112201 A1    May 10, 2012

(51) Int. Cl.
*H01L 23/48* (2006.01)
(52) U.S. Cl.
USPC .......... 257/772; 257/779; 257/E23.023
(58) Field of Classification Search
USPC ........................... 257/76, 772
See application file for complete search history.

(56) References Cited

U.S. PATENT DOCUMENTS

| 2005/0073039 A1* | 4/2005 | Kasuya et al. ........ 257/690 |
| 2006/0151871 A1 | 7/2006 | Mehrotra |
| 2007/0205253 A1* | 9/2007 | Hubner ........ 228/193 |

FOREIGN PATENT DOCUMENTS

| JP | 4-503480 A | 6/1992 |
| WO | 90/09255 A1 | 8/1990 |
| WO | 2006/074165 A2 | 7/2006 |

OTHER PUBLICATIONS

Warren C. Welch et al., "Transfer of Metal MEMS Packages Using a Wafer-Level Solder Transfer Technique", IEEE Transactions on Advanced Packaging, vol. 28, No. 4, Nov. 2005, pp. 643-649.
Brian Rowden et al., "High Temperature SiC Power Module Packaging", Proceedings of the ASME 2009 International Mechanical Engineering Congress & Exposition, IMECE2009, Nov. 13-19, Lake Buena Vista, Florida, USA, pp. 1-6.

* cited by examiner

*Primary Examiner* — Eva Yan Montalvo
(74) *Attorney, Agent, or Firm* — Cantor Colburn LLP

(57) ABSTRACT

A high melting point soldering layer includes a low melting point metal layer, a first high melting point metal layer disposed on a surface of the low melting point metal layer, and a second high melting point metal layer disposed at a back side of the low melting point metal layer. The low melting point metal layer, the first high melting point metal layer, and the second high melting point metal layer are mutually alloyed by transient liquid phase bonding, by annealing not less than a melting temperature of the low melting point metal layer, diffusing the metal of the low melting point metal layer into an alloy of the first high melting point metal layer and the second high melting point metal layer. The high melting point soldering layer has a higher melting point temperature than that of the low melting point metal layer. It is provided a binary based high melting point soldering layer having TLP bonding of a high melting point according to a low temperature processing, a fabrication method for the high melting point soldering layer and a semiconductor device to which the high melting point soldering layer is applied.

10 Claims, 11 Drawing Sheets

HIGH MELTING POINT SOLDERING LAYER ALLOYED BY TRANSIENT LIQUID PHASE AND FABRICATION METHOD FOR THE SAME, AND SEMICONDUCTOR DEVICE

TECHNICAL FIELD

The present invention relates to a high melting point soldering layer, a fabrication method for the high melting point soldering layer, and a semiconductor device. More specifically, the present invention relates to a high melting point soldering layer fabricated by TLP (Transient Liquid Phase) bonding, a fabrication method for the high melting point soldering layer, and a semiconductor device.

BACKGROUND

Currently, research and development of an SiC (Silicon Carbide) device are done in many research institutions. As a characteristic of the SiC devices, it can be mentioned of low on resistance, high speed switching, high temperature operation, etc.

Conventionally, since the temperature span which can operate in Si devices, such as IGBTs (Insulated Gate Bipolar Transistors), currently used in the field of a semiconductor power module is to about 150 degrees C., it was possible to have driven even when using low melting point solder, such as a conventional Sn—Ag alloy system.

However, since the SIC devices can theoretically operate to about 400 degrees C., if the SIC devices are driven at high temperature when using the conventional low melting point solder, the short circuit between electrodes, the delamination between the SiC devices and a base plate, etc. occurred by fusing bonding parts when using the low melting point solder, and then the reliability of the SiC devices are spoiled.

Accordingly, the SiC devices could not be driven at high temperature, and the characteristic of the SiC devices was not able to be used.

It is already disclosed about an interconnection method of the SiC device, and a low thermal resistance package (for example, refer to Patent Literature 1 and Patent Literature 2). In Patent Literature 1 and Patent Literature 2, a fabrication method of the package housing the SiC device is disclosed, and the SiC device is bonded for other parts or conductive surfaces using TLP bonding technology.

The TLP technology currently disclosed in the literatures is the technology for bonding the SIC device by fabricating high temperature melting point bonding using the mixed crystal of three kinds or four kinds of conductive metals fabricated simultaneously. Since the TLP bonding of three kinds or four kinds of metallic materials is used as a result, the components of the mixed crystal of the conductive metal are complicated.

On the other hand, it is already disclosed about a compound solder article whose melting point is comparatively low (for example, the melting point is not more than 430 degrees C.) including Sn and/or Pb (for example, refer to Patent Literature 3). In Patent Literature 3, the solder alloy has a smaller difference in temperature of the liquid phase and solid phase than that of the basic solder.

Furthermore, it is already disclosed also about transfer of metal MEMS packages using a wafer-level solder transfer technology (for example, refer to Non Patent Literature 1) In Non Patent Literature 1, a device wafer and a package cap are bonded by TLP technology using relatively thin Ni—Sn layer.

CITATION LIST

Patent Literature 1: PCT International Publication No. WO2006/074165

Patent Literature 2: U.S. Patent Application Publication No. 2006/0151871

Patent Literature 3: Published Japanese Translations of PCT International Publication for Patent Application No. H04-503480

Non Patent Literature 1: Warren C. Welch, III, Junseok Chae, and Khalil Najafi, "Transfer of Metal MEMS Packages Using a Wafer-Level Solder Transfer Technique", IEEE TRANSACTION ON ADVANCED PACKAGING, VOL, 28, No. 4, November 2005, pp. 643-649

SUMMARY OF THE INVENTION

Technical Problem

Currently, in order to satisfy a Pb-free request, generally, Sn—Ag solder etc. which are low melting point solder are used. However, as stated above, the low melting point solder cannot be used with the device in which a high temperature drive is possible such as SiC since the melting temperatures are low at the maximum about 230 degrees C.

The present inventors found out a method of obtaining a high melting point alloy by dissolving of low melting point solder and diffusing the dissolved low melting point solder into high melting point solder. That is, the present inventors found out a fabrication method for a high melting point soldering layer characterized by having a larger difference in temperature of a liquid phase and a solid phase with the solder alloy than that of the basic solder using TLP bonding of only two kinds of metallic materials. The high melting point soldering layer uses relatively thick solder, and has a melting temperature not less than a melting temperature of a low melting point metal layer.

The purpose of the present invention is to provide a binary based high melting point soldering layer having TLP bonding of a high melting point according to a low temperature processing, and a fabrication method for the same.

Moreover, the purpose of the present invention is to provide a semiconductor device to which the high melting point soldering layer is applied.

Solution to Problem

According to an aspect of the present invention, a high melting point soldering layer comprises a low melting point metal layer; a first high melting point metal layer disposed on a surface of the low melting point metal layer; and a second high melting point metal layer disposed at a back side of the low melting point metal layer, wherein the low melting point metal layer, the first high melting point metal layer, and the second high melting point metal layer are mutually alloyed by transient liquid phase bonding.

According to another aspect of the present invention, a semiconductor device comprises an insulating substrate; a first conducting metal layer disposed on the insulating substrate; a first high melting point soldering layer disposed on the first conducting metal layer; and a semiconductor device disposed on the first high melting point soldering layer, wherein the first high melting point soldering layer is formed by transient liquid phase bonding.

According to another aspect of the present invention, a semiconductor device comprises an insulating substrate; a second conducting metal layer disposed on the insulating substrate; a second high melting point soldering layer disposed on the second conducting metal layer; and a base plate disposed on the second high melting point soldering layer, wherein the second high melting point soldering layer is formed by transient liquid phase bonding.

According to another aspect of the present invention, a fabrication method for a high melting point soldering layer comprises performing planarization of a low melting point metal layer, a first high melting point metal layer disposed on a surface of the low melting point metal layer, and a second high melting point metal layer disposed at a back side of the low melting point metal layer; annealing not less than a melting temperature of the low melting point metal layer, diffusing the metal of the low melting point metal layer into an alloy of the first high melting point metal layer and the second high melting point metal layer, and forming transient liquid phase bonding; and cooling the transient liquid phase bonding, wherein a melting temperature not less than the melting temperature of the low melting point metal layer is used.

The present invention embodies an electronic packaging method suitable for high temperature operation of semiconductor devices such as silicon carbide and other wide band gap semiconductors. The attachment method utilizes a TLP bonding method to produce stable high temperature attachments (>300 degrees C.) that can be applied at a single device level or expanded to large area interconnects. The processing temperatures required to achieve the TLP bond are significantly lower than the melting point of the final alloy through the use of a low melting point metal in conjunction with a high temperature base metal that produces stable high temperature transitional alloys through diffusion. The additional wetting layer utilized provides a highly reactive bond layer to external metal systems from the device or other components to be bonded. The level of the wetting layer is comparable to the target TLP alloy and tailored to the device or bonding metal applied.

The metal system utilized in the present disclosure is compatible with traditional silver backed devices utilizing a silver based TLP structure to minimize intermetallic compositions as well as other costly material components and meeting the requirements of ROHS compliance with the elimination of lead bearing components. The metallization utilized on the components to be bonded are standard requirements for solderable attachments such as standard device metal and nickel based barrier metals. With the additional wetting layer alloy formation, there are no additional mechanical or planarization steps required to ensure high temperature bond line formation.

Advantageous Effects of Invention

According to the present invention, it can be provided with the binary based high melting point soldering layer having the TLP bonding of the high melting point according to the low temperature processing, and the fabrication method for the same.

Moreover, according to the present invention, it can be provided with the semiconductor device to which the high melting point soldering layer is applied.

DESCRIPTION OF EMBODIMENTS

Figure 1:
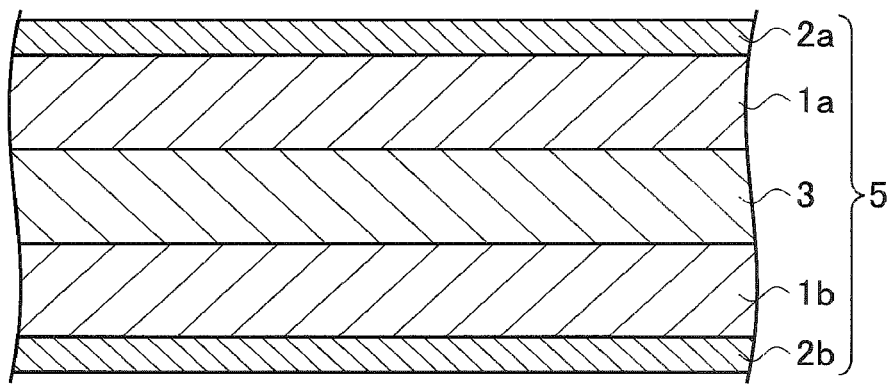
FIG. 1 is a schematic cross-sectional configuration diagram of a high melting point soldering layer according to a first embodiment of the present invention.

Next, embodiments of the invention will be described with reference to drawings. In the description of the following drawings, the identical or similar reference numeral is attached to the identical or similar part. However, it should be known about that the drawings are schematic and the relation between thickness and the plane size and the ratio of the thickness of each layer differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

[First Embodiment]
(Configuration of High Melting Point Soldering Layer)

As shown in FIG. 1, a high melting point soldering layer 5 according to a first embodiment includes: a low melting point metal layer 3; a first high melting point metal layer 1a disposed on the surface of the low melting point metal layer 3; and a second high melting point metal layer 1b disposed at the back side of the low melting point metal layer 3. The low melting point metal layer 3, the first high melting point metal layer 1a, and the second high melting point metal layer 1b are mutually alloyed by TLP bonding.

As a result, as for a melting point of the high melting point soldering layer 5 according to the first embodiment, a melting point between a melting points of the low melting point metal layer 3 and a melting point of the first high melting point metal layer 1a and/or the second high melting point metal layer 1b is obtained.

The low melting point metal layer 3 is formed with a Sn layer or a Sn—Ag eutectic solder layer, and the first high melting point metal layer 1a and the second high melting point metal layer 1b are formed with an Ag layer.

Moreover, the first high melting point metal layer 1a may be formed with an Ag layer, and the second high melting point metal layer 1b may be formed with an Ni layer.

Figure 10:
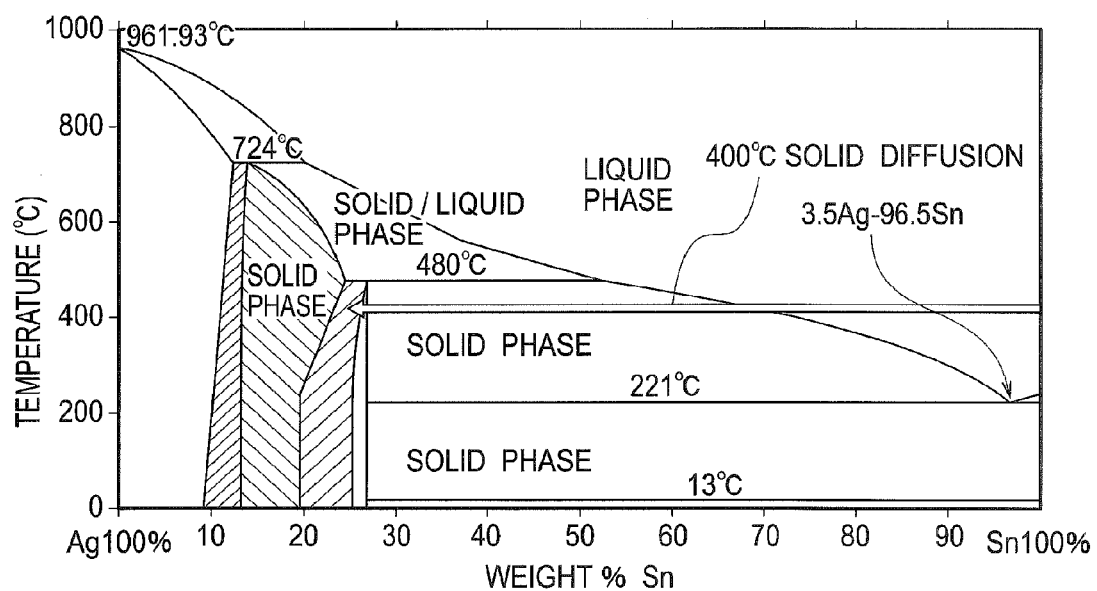
FIG. 10 is a rationale diagram of phase change of the high melting point soldering layer according to the first embodiment of the present invention, and is a binary phase transition diagram of Ag—Sn solder.

As shown in FIG. 10 described later, the Sn—Ag eutectic solder layer is composed of composition of 96.5±1% of Sn, and 3.5±1% of Ag.

The temperature for forming the TLP bonding is not less than 250 degrees C. and not more than 480 degrees C., and is not less than 400 degrees C. and not more than 480 degrees C. preferable.

Moreover, it may be further provided with a low melting point adhesive layer for covering the first high melting point metal layer 1a and the second high melting point metal layer 1b. For example, as shown in FIG. 1, it may be provided with a first low melting point adhesive layer 2a disposed on the surface of the first high melting point metal layer 1a of the opposite side of the back side where the low melting point metal layer 3 is disposed, and a second low melting point adhesive layer 2b disposed at the back side of the second high melting point metal layer 1b of the opposite side of the surface where the low melting point metal layer 3 is disposed. Each of the first low melting point adhesive layer 2a and the second low melting point adhesive layer 2b is a layer for the improvement in wettability.

The low melting point metal layer 3 is formed with an Sn layer or an Sn—Ag layer, for example, and the first high melting point metal layer and the second high melting point metal layer are formed with an Ag layer, for example.

The first low melting point adhesive layer 2a and the second low melting point adhesive layer 2b are formed with an Sn layer, for example.

(Semiconductor Device)

Figure 2:
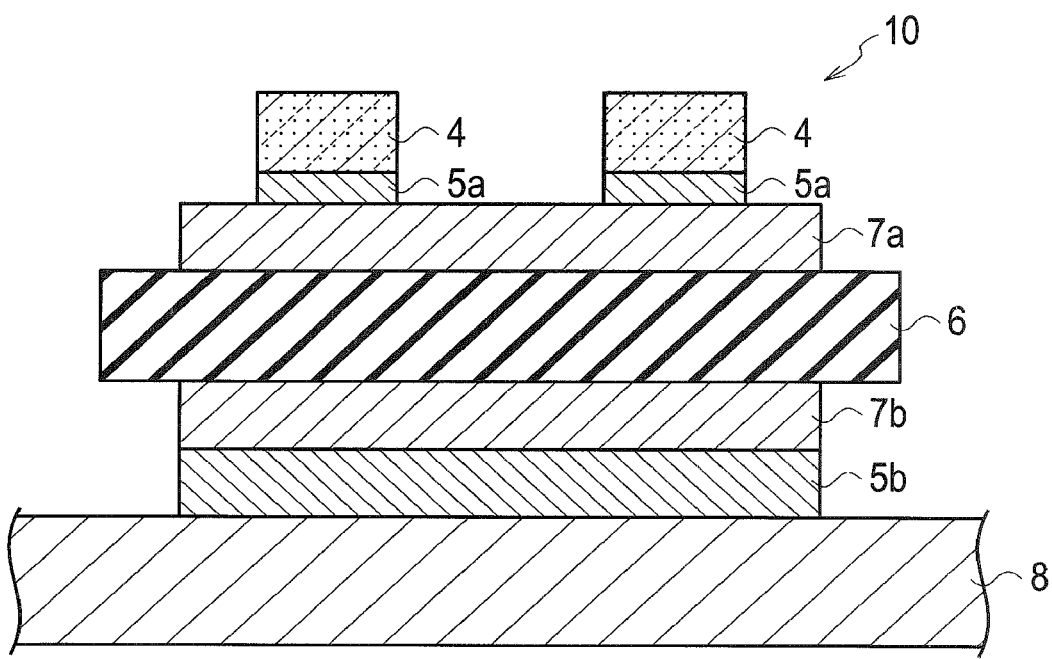
FIG. 2 is a schematic cross-sectional configuration diagram of a semiconductor device according to the first embodiment of the present invention.

As shown in FIG. 2, a schematic cross-section structure of a semiconductor device 10 to which the high melting point soldering layer according to the first embodiment is applied includes: an insulating substrate 6, a first conducting metal layer 7a disposed on the insulating substrate 6, a first high melting point soldering layer 5a disposed on the first conducting metal layer 7a, and a semiconductor device 4 disposed on the first high melting point soldering layer 5a.

The semiconductor device 10 may further includes: a second conducting metal layer 7b disposed at the back side of the insulating substrate 6 of the opposite side of the surface where the first conducting metal layer 7a is disposed, a second high melting point soldering layer 5b disposed at the back side of the second conducting metal layer 7b of the opposite side of the surface of the second conducting metal layer 7b where the insulating substrate 6 is disposed, and a base plate 8 disposed at the back side of the second high melting point soldering layer 5b of the opposite side of the surface of the second high melting point soldering layer 5b where the second conducting metal layer 7b is disposed.

As shown in FIG. 1, each of the first high melting point soldering layer 5a and the second high melting point soldering layer 5b includes: the low melting point metal layer 3; the first high melting point metal layer 1a disposed on the surface of the low melting point metal layer 3; and the second high melting point metal layer 1b disposed at the back side of the low melting point metal layer 3. The low melting point metal layer 3, the first high melting point metal layer 1a, and the second high melting point metal layer 1b are mutually alloyed by the TLP bonding.

Moreover, the semiconductor device 10 to which the high melting point soldering layer according to the first embodiment is applied may simply includes: the insulating substrate 6; the second conducting metal layer 7b disposed on the insulating substrate 6; the second high melting point soldering layer 5b disposed on the second conducting metal layer 7b; and the base plate 8 disposed on the second high melting point soldering layer 5b. In this case, the second high melting point soldering layer 5b is formed by the TLP bonding.

The first high melting point soldering layer 5a formed by the TLP bonding technology is used in order to bond the first conducting metal layer 7a and the semiconductor device 4. The second high melting point soldering layer 5b formed by the TLP bonding technology is used in order to bond the second conducting metal layer 7b and the base plate 8.

A formation sequence of the high melting point soldering layer by the TLP technology includes following two steps. As a first step, the second conducting metal layer 7b and the base plate 8 are bonded by using the second high melting point soldering layer 5b. Next, as a second step, the first conducting metal layer 7a and the semiconductor device 4 are bonded by using the first high melting point soldering layer 5a. Since the thermal capacity of the base plate 8 is larger than the thermal capacity of the semiconductor device 4, as the first step, the bonding required for considerable time is previously performed by bonding the second conducting metal layer 7b and the base plate 8, and then as the second step, the first conducting metal layer 7a and the semiconductor device 4 are bonded for a short time. Accordingly, the semiconductor device 4 can be protected thermally.

Figure 3:
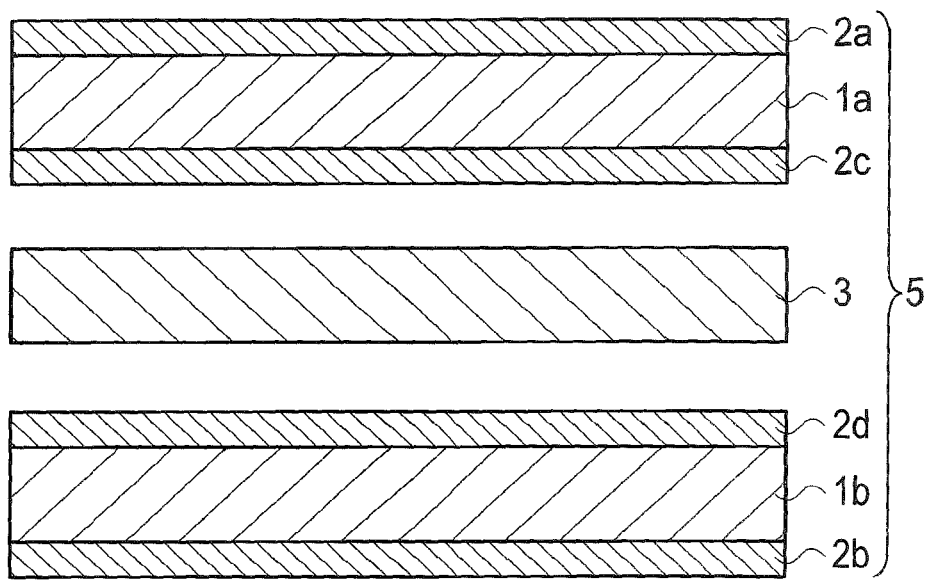
FIG. 3 is a schematic cross-sectional configuration diagram for explaining a layered structure of the high melting point soldering layer according to the first embodiment of the present invention.

As shown in FIG. 3, the first high melting point soldering layer 5a and the second high melting point soldering layer 5b may include a third low melting point adhesive layer 2c disposed at the back side of the first high melting point metal layer 1a opposite the first low melting point adhesive layer 2a disposed on the surface of the first high melting point metal layer 1a; and a fourth low melting point adhesive layer 2d disposed on the surface of the first high melting point metal layer 1a opposite the second low melting point adhesive layer 2b disposed at the back side of the second high melting point metal layer 1b.

The third low melting point adhesive layer 2c and the fourth low melting point adhesive layer 2d are formed with an Sn layer, for example as well as the first low melting point adhesive layer 2a and the second low melting point adhesive layer 2b.

As a result, the low melting point metal layer 3, the first high melting point metal layer 1a, and the second high melting point metal layer 1b are mutually alloyed by the TLP bonding as well as the example shown in FIG. 1.

In FIG. 3, the low melting point metal layer 3 is formed with an Ag—Sn layer having a thickness of about 25 μm. The first high melting point metal layer 1a and the second high melting point metal layer 1b are formed with an Ag layer, for example. The first low melting point adhesive layer 2a, the second low melting point adhesive layer 2b, the third low melting point adhesive layer 2c, and the fourth low melting point adhesive layer 2d are formed with a plating Sn layer having a thickness of about 0.5 μm to 1.5 μm, for example.

The high melting point soldering layer 5 having the structure shown in FIG. 3 is pressed mechanically with a press machine, in order to perform a planarization. The mechanical pressure at this time is about 26.7 MPa, for example.

It is effective to select the material near the coefficient of thermal expansion of the insulating substrate 6, for example, materials composed of compositions of copper and molybdenum (CuMo), copper and tungsten (CuW), aluminum silicon carbide (AlSiC), or other metal matrix composites with adaptive thermal expansion ranges, as a material of the base plate 8. It is because the curvature accompanying the difference of the coefficient of thermal expansion between the insulating substrate 6 and the base plate 8 can be suppressed and the reliability of the semiconductor device 4 can be improved by selecting the material near the coefficient of thermal expansion of the insulating substrate 6 as a material of the base plate 8.

On the surface of the base plate 8 bonded to the second high melting point soldering layer 5b, nickel plating etc. having a thickness of about 2 μm to 15 μm may be performed, for example, in order to improve the wettability between the base plate 8 and the second high melting point soldering layer 5b.

The insulating substrate 6 sandwiched between the first conducting metal layer 7a and the second conducting metal layer 7b can be formed with alumina ($Al_2O_3$), aluminum nitride (AlN) or silicon nitride ($Si_3N_4$), etc., for example.

Figure 4:
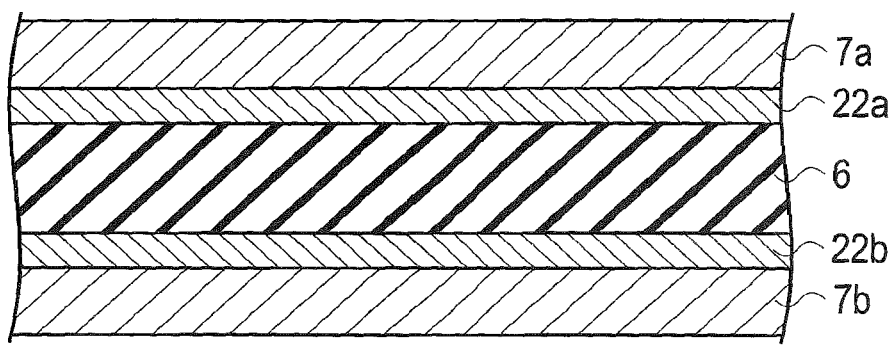
FIG. 4 is a detailed schematic cross-sectional configuration diagram of an insulating substrate of FIG. 2.

As shown in FIG. 4, the first barrier metal layer 22a, the second barrier metal layer 22b, etc. may be also formed to the insulating substrate 6 in order to improve wettability with the first conducting metal layer 7a and the second conducting metal layer 7b and to barrier the solder. The first barrier metal layer 22a and the second barrier metal layer 22b are effective to form with an Ni plated layer or a Ti layer, for example.

Each of the first conducting metal layer 7a and the second conducting metal layer 7b can be formed with aluminum (Al), copper (Cu), and other conductive metals which can flow through the suitable amount of current value. The first conducting metal layer 7a and the second conducting metal layer 7b have a thickness of about 0.1 mm to about 0.5 mm, for example.

(Fabrication Method of High Melting Point Soldering Layer)

A schematic cross-section structure for explaining one process of a fabrication method for the high melting point soldering layer according to the first embodiment is expressed as shown in FIG. 5 to FIG. 9. Moreover, a binary phase transition diagram of Ag—Sn based solder is expressed as shown in FIG. 10, as the high melting point soldering layer according to the first embodiment.

The fabrication method for the high melting point soldering layer according to the first embodiment includes: the step of performing the planarization of the low melting point metal layer 14, the first high melting point metal layer 12a disposed on the surface of the low melting point metal layer 14, and the second high melting point metal layer 12b disposed at the back side of the low melting point metal layer 14; the step of forming the TLP bonding by annealing not less than the melting temperature of the low melting point metal layer 14, and diffusing the metal of the low melting point metal layer 14 into the alloy of the first high melting point metal layer 12a and the second high melting point metal layer 12b; and the step of cooling the TLP bonding. As a result, it is obtained of the high melting point soldering layer 5 having a melting temperature not less than the melting temperature of the low melting point metal layer 14.

The low melting point metal layer 14 is formed with an Sn layer or an Sn—Ag eutectic solder layer, and the first high melting point metal layer 12a and the second high melting point metal layer 12b are formed with an Ag layer.

Alternatively, the first high melting point metal layer 12a may be formed with an Ag layer, and the second high melting point metal layer 12b may be formed with an Ni layer.

The Sn—Ag eutectic solder layer is composed of composition of 96.5±1% of Sn, and 3.5±1% of Ag.

The temperature for forming the TLP bonding is not less than 250 degrees C. and not more than 480 degrees C., and is not less than 400 degrees C. and not more than 480 degrees C. preferable.

Hereinafter, the fabrication method for the high melting point soldering layer according to the first embodiment will be explained in detail.

Figure 5:
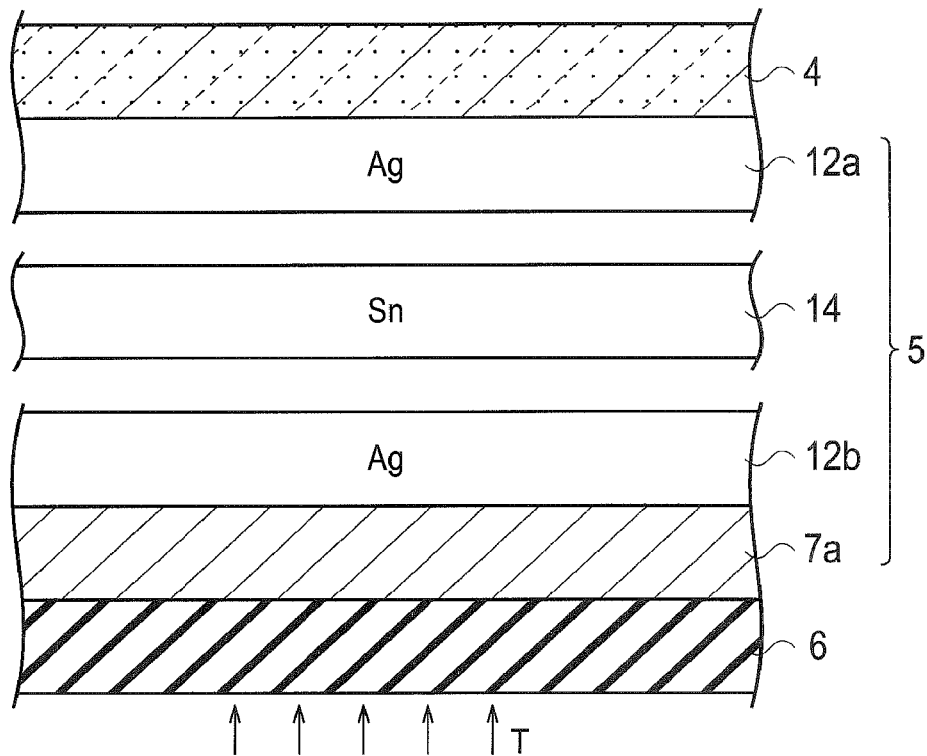
FIG. 5 is a schematic cross-sectional configuration diagram (I) for explaining one process of a fabrication method of the high melting point soldering layer according to the first embodiment of the present invention.

(a) first of all, as shown in FIG. 5, when the high melting point soldering layer 5 of layer shape including the low melting point metal layer 14 composed of an Sn layer, the first high melting point metal layer 12a disposed on the surface of the low melting point metal layer 14 and composed of an Ag layer, and the second high melting point metal layer 12b disposed at the back side of the low melting point metal layer 14 and composed of an Ag layer is disposed between the first conducting metal layer 7a on the insulating substrate 6, and the semiconductor device 4, and is annealed at the heating temperature T of about 250 degrees C., the low melting point metal layer 14 is dissolve.

Figure 6:
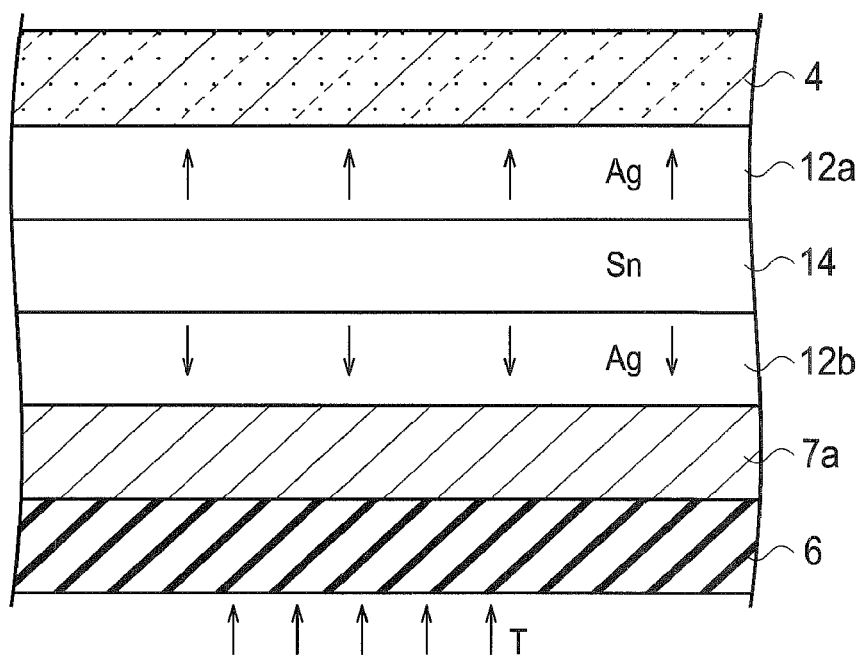
FIG. 6 is a schematic cross-sectional configuration diagram (II) for explaining one process of the fabrication method of the high melting point soldering layer according to the first embodiment of the present invention.

(b) Next, when the annealing temperature T is raised to about 400 degrees C., as shown in FIG. 6, the transient liquid phase of Sn is started toward the first high melting point metal layer 12a from the low melting point metal layer 14. Simultaneously, the transient liquid phase of Sn is started toward the second high melting point metal layer 12b from the low melting point metal layer 14.

Figure 7:
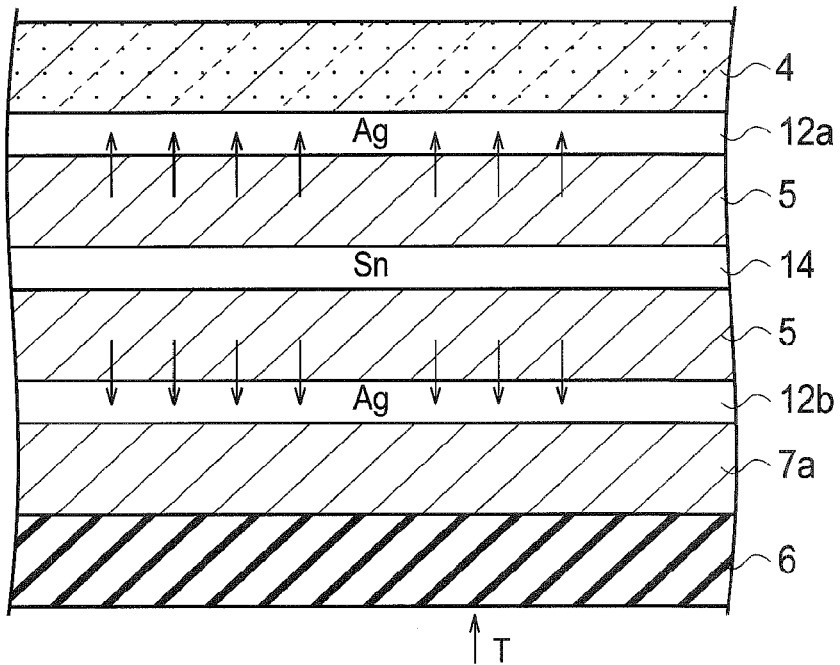
FIG. 7 is a schematic cross-sectional configuration diagram (III) for explaining one process of the fabrication method of the high melting point soldering layer according to the first embodiment of the present invention.

(c) Next, if the annealing temperature T shall be about 400 degrees C. and the annealing time is continued, as shown in FIG. 7, the high melting point soldering layer 5 composed of an Ag—Sn alloy is formed between the low melting point metal layer 14 and the first high melting point metal layer 12a by the transient liquid phase of Sn toward the first high melting point metal layer 12a from the low melting point metal layer 14. Similarly, the high melting point soldering layer 5 composed of an Ag—Sn alloy is formed also between the low melting point metal layer 14 and the second high melting point metal layer 12b by the transient liquid phase of Sn toward the second high melting point metal layer 12b from the low melting point metal layer 14. As shown in FIG. 7, each of the low melting point metal layer 14, the first high melting point metal layer 12a, and the second high melting point metal layer 12b is thin-layerized by the transient liquid phase of Sn.

Figure 8:
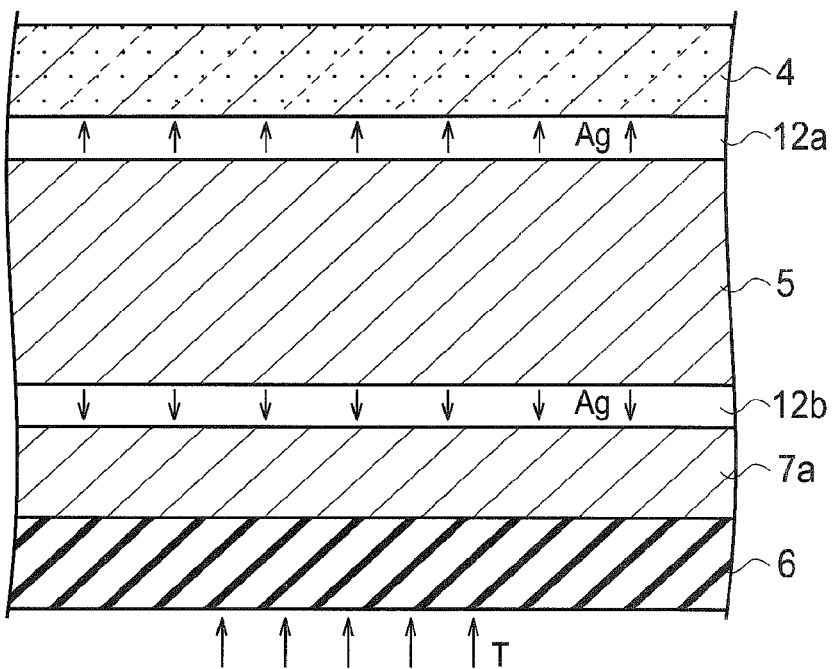
FIG. 8 is a schematic cross-sectional configuration diagram (IV) for explaining one process of the fabrication method of the high melting point soldering layer according to the first embodiment of the present invention.

(d) If the annealing temperature T shall be about 400 degrees C. and the annealing time is further continued, as shown in FIG. 8, the low melting point metal layer 14 is disappeared, the high melting point soldering layer 5 composed of an Ag—Sn alloy is formed thickly, and each of the first high melting point metal layer 12a and the second high melting point metal layer 12b is further thin-layerized.

Figure 9:
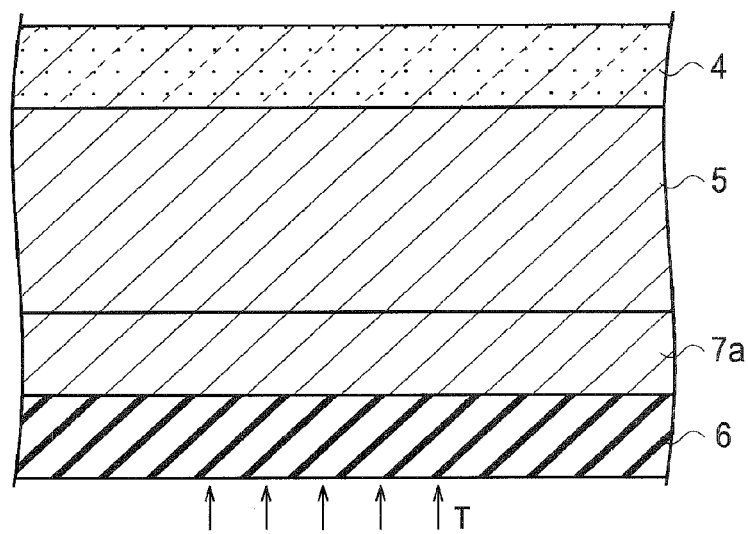
FIG. 9 is a schematic cross-sectional configuration diagram (V) for explaining one process of the fabrication method of the high melting point soldering layer according to the first embodiment of the present invention.

(e) If the annealing temperature T shall be about 400 degrees C. and the annealing time is further continued, as shown in FIG. 9, each of the first high melting point metal layer 12a and the second high melting point metal layer 12b is disappeared, and the high melting point soldering layer 5 composed of an Ag—Sn alloy is formed between the first conducting metal layer 7a on the insulating substrate 6, and the semiconductor device 4.

In the explanation of the fabrication method for the high melting point soldering layer according to the first embodiment, the reason that the value of the annealing temperature T shall be about 400 degrees C. is that it can obtain the high melting point alloy of 480 degrees C. by Sn which is the low melting point solder dissolving, and performing the solid phase diffusion into the Ag layer which is the high melting point solder in 400 degrees C., as shown in the binary phase transition diagram of the Ag—Sn based solder of FIG. 10.

As shown in FIG. 10, the Ag—Sn based solder is dissolved at 400 degrees C. in 10% to 28% of the concentration of Sn, and it can obtain high melting point solid phase of 480 degrees C.

(Substrate Attachment Process)

Figure 11:
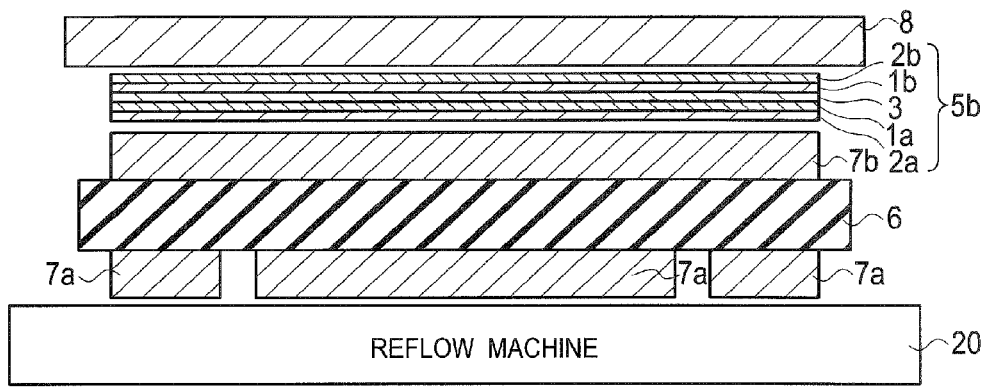
FIG. 11 is a schematic cross-sectional configuration diagram for explaining a substrate attachment process as one process of a fabrication method of the semiconductor device according to the first embodiment of the present invention.

As one process of a fabrication method for the semiconductor device 10 according to the first embodiment, a schematic cross-section structure for explaining a substrate attachment process is expressed as shown in FIG. 11. Moreover, the relation between the annealing temperature T and the time t for explaining the details of the substrate attachment process of FIG. 11 is expressed as shown in FIG. 12.

In FIG. 11, the low melting point metal layer 3 is formed with an Ag—Sn layer having a thickness of about 25 μm, for example. The first high melting point metal layer 1a and the second high melting point metal layer 1b are formed with an Ag layer, for example. The first low melting point adhesive layer 2a and the second low melting point adhesive layer 2b are formed with a plating Sn layer having a thickness of about 1.5 μm, for example.

The high melting point soldering layer 5 having the structure shown in FIG. 1 is pressed mechanically with a press machine, in order to perform a planarization. The mechanical pressure at this time is about 26.7 MPa, for example.

Figure 12:
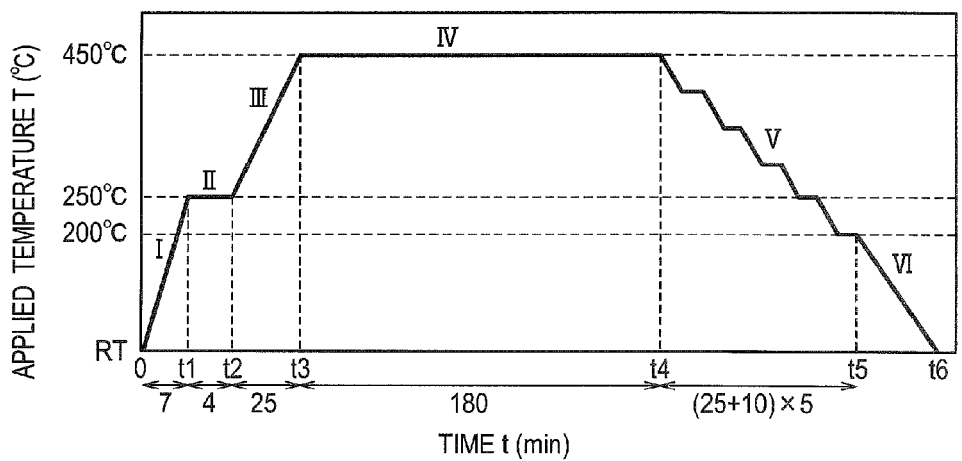
FIG. 12 is a relational diagram of a temperature and time for explaining the detailed process of the substrate attachment process of FIG. 11.

As shown in FIG. 11, the substrate attachment process of the fabrication method of the semiconductor device 10 according to the first embodiment performs the process condition shown in FIG. 12 in the configuration disposing the insulating substrate 6 in which the first conducting metal layer 7a and the second conducting metal layer 7b are formed on the reflow machine 20, and disposing the base plate 8 via the second high melting point soldering layer 5b on the second conducting metal layer 7b.

(I) First of all, the annealing temperature T is raised from the room temperature RT to about 250 degrees C. in 7 minutes of time 0 to time t1. The annealing temperature T is set up not less than the melting temperature for forming the liquid phase of the metal of the low melting point metal layer 3, in order to begin to melt the metal of the low melting point metal layer 3 into the TLP alloy. It is preferable to apply a certain amount of pressure in order to activate the liquid phase at low temperature. In the configuration of FIG. 11, loading weight in particular for pressurization is not performed since the weight of the base plate 8 is heavy.

(II) Next, the annealing temperature T is kept up at about 250 degrees C. for 4 minutes of time t1 to time t2.

(III) Next, the annealing temperature T is risen from about 250 degrees C. to about 450 degrees C. in 25 minutes of time t2 to time t3. The annealing temperature T is raised until it obtains the binary based Ag—Sn based alloy of a target in order to assist to diffuse the metal of the low melting point metal layer 3 into the structure of the TLP alloy.

(IV) Next, the annealing temperature T is kept up at about 450 degrees C. for 180 minutes of time t3 to time t4.

(V) Next, in 175 minutes of time t4 to time t5, first of all, the annealing temperature T is reduced to about 400 degrees C. by 2 degrees C./min. in 25 minutes, and is kept up for 10 minutes, and then the operation is repeated until it becomes about 200 degrees C. at 50 degrees C. step hereinafter. In the semiconductor device 10 according to the first embodiment, the size of the second high melting point soldering layer 5b is large, and the thermal capacity is also large. Accordingly, the stress reduction of the second high melting point soldering layer 5b having great size can be performed according to such a controlled cooling process.

(VI) Next, in the period of time t5 to the time t6, self-cooling is performed from about 200 degrees C. to the room temperature RT.

As a result, as for the low melting point metal layer 3 composed of an Ag—Sn alloy of the binary based, the concentration of Ag changes to about 75% from about 3.5%, and then the high melting point soldering layer 5b is obtained.

(Semiconductor Device Attachment Process)

Figure 13:
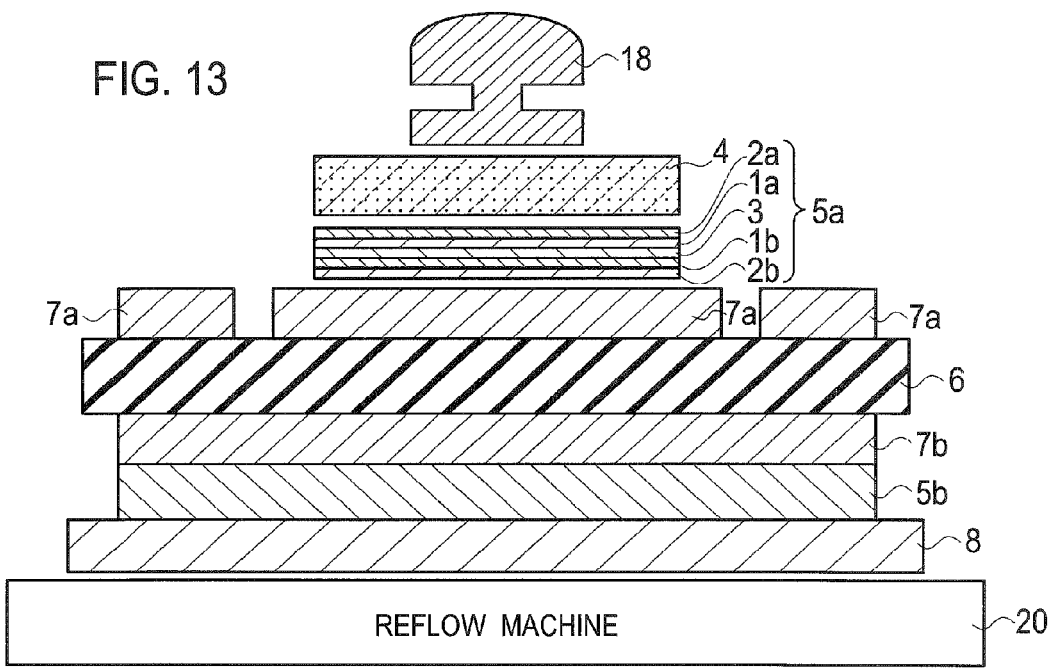
FIG. 13 is a schematic cross-sectional configuration diagram for explaining a semiconductor device attachment process as one process of the fabrication method of the semiconductor device according to the first embodiment of the present invention.
Figure 14:
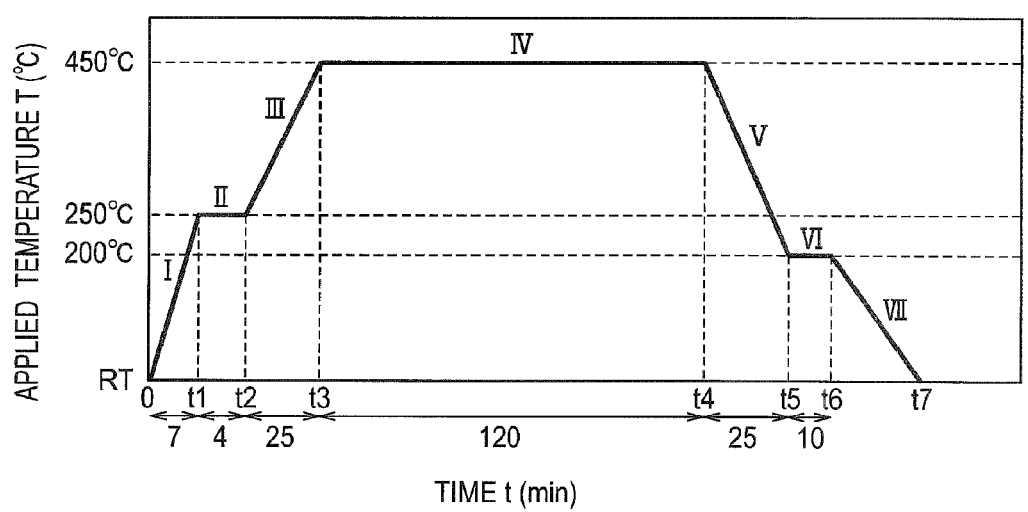
FIG. 14 is a relational diagram of a temperature and time for explaining the detailed process of the semiconductor device attachment process of FIG. 13.

A schematic cross-section structure for explaining a semiconductor device attachment process is expressed as shown in FIG. 13, as one process of a fabrication method of the semiconductor device 10 according to the first embodiment. Moreover, the relation between the annealing temperature T and the time t for explaining the details of the semiconductor device attachment process of FIG. 13 are expressed as shown in FIG. 14.

In FIG. 13, the low melting point metal layer 3 is formed with an SnAg layer having a thickness of about 25 μm, for example. The first high melting point metal layer 1a and the second high melting point metal layer 1b are formed with an Ag layer having a thickness of about 0.2 μm to about 1 μm, for example. The first low melting point adhesive layer 2a and the second low melting point adhesive layer 2b are formed with a plating Sn layer having a thickness of about 0.5 μm, for example.

In the attachment process of the semiconductor device 4, the point of preventing the drain electrode of the semiconductor device 4 from reacting completely is important during the reactions of TLP bonding formation. Accordingly, the Sn plated layer is made thin by forming the Sn plated layer having a thickness of about 0.5 μm compared with the Sn plated layer having a thickness of about 1.5 μm used at the time of the substrate attachment process.

The high melting point soldering layer 5 having the structure shown in FIG. 1 is pressed mechanically with a press machine, in order to make a flat. The mechanical pressure at this time is about 26.7 MPa, for example.

The semiconductor device attachment process of the fabrication method for the semiconductor device 10 according to the first embodiment performs the process condition shown in FIG. 14, after the substrate attachment process, in the configuration disposing the layered structure composed of the base plate 8, the second high melting point soldering layer 5b, the second conducting metal layer 7b, the insulating substrate 6, and the first conducting metal layer 7a and disposing the semiconductor device 4 via the first high melting point soldering layer 5a on the first conducting metal layer 7a on the reflow machine 20 as shown in FIG. 13. In the configuration of FIG. 13, loading weight is performed by disposing a weight 18 for pressurization in particular on the semiconductor device 4.

(I) First of all, the annealing temperature T is raised from the room temperature RT to about 250 degrees C. in 7 minutes of time 0 to time t1. The annealing temperature T is set up not less than the melting temperature for forming the liquid phase of the metal of the low melting point metal layer 3, in order to begin to melt the metal of the low melting point metal layer 3 into the TLP alloy. It is preferable to apply a certain amount of pressure in order to activate the liquid phase at low temperature.

(II) Next, the annealing temperature T is kept up at about 250 degrees C. for 4 minutes of time t1 to time t2.

(III) Next, the annealing temperature T is raised from about 250 degrees C. to about 450 degrees C. in 5 minutes of time t2 to time t3. The annealing temperature T is raised until it obtains the binary based Ag—Sn based alloy of a target in order to assist to diffuse the metal of the low melting point metal layer 3 into the structure of the TLP alloy.

(IV) Next, the annealing temperature T is kept up at about 450 degrees C. for 180 minutes of time t3 to time t4.

(V) Next, the annealing temperature T is reduced to about 200 degrees C. by 10 degrees C./min. in 25 minutes of time t4 to time t5. In the semiconductor device 10 according to the first embodiment, the size of the first high melting point soldering layer 5a is large, and the thermal capacity is also large. Accordingly, the stress reduction of the first high melting point soldering layer 5a having great size can be performed according to such a controlled cooling process.

(VI) Next, the annealing temperature T is kept up at about 200 degrees C. in the period of time t5 to time t6.

(VII) Next, self-cooling is performed from about 200 degrees C. to the room temperature RT in the period of time t6 to time t7.

As a result, as for the low melting point metal layer 3 composed of an Ag—Sn alloy of the binary based, the concentration of Ag changes to about 75% from about 3.5%, and then the high melting point soldering layer 5a is obtained.

In the semiconductor device 10 according to the first embodiment, it is important that the point of preventing the drain electrode of the semiconductor device 4 from reacting to the Sn layer completely in the TLP bonding formation reaction at the time of the attachment process of the semiconductor device 4 secures electric and mechanical reliability.

In the semiconductor device 10 according to the first embodiment, also when operating at above 300 degrees C., stable operation is verified.

(Die Detachment Strength)

Figure 15:
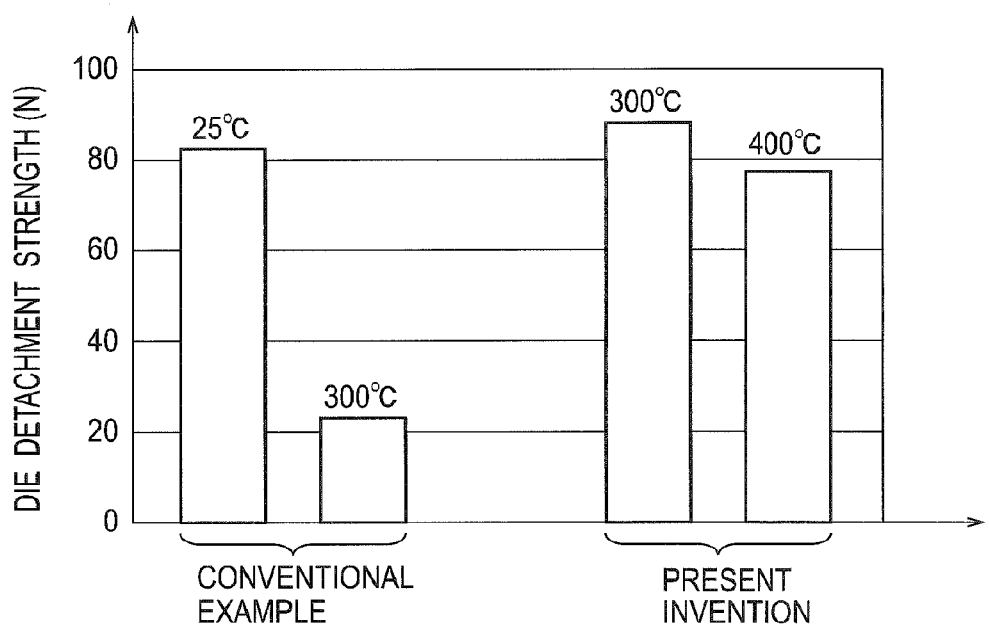
FIG. 15 is a comparative diagram of die detachment strength between a conventional example and the present invention in the case of changing temperature.

In the conventional semiconductor device fabricated by using the Pb—Sn based low melting point soldering layer, and the semiconductor device according to the first embodiment produced by using the Ag—Sn based high melting point soldering layer, the comparison of the die detachment strength in the case of changing the ambient temperature is expressed as shown in FIG. 15. In the conventional semiconductor device fabricated by using the Pb—Sn based low melting point soldering layer, as shown in FIG. 15, although the die detachment strength of about 80 N is provided at 25 degrees C., it becomes the die detachment strength of about 20 N at 300 degrees C. and therefore the die detachment strength is reducing remarkably. On the other hand, in the semiconductor device fabricated by using the Ag—Sn based high melting point soldering layer according to the first embodiment, the die detachment strength of about 80 N is provided also in 300 degrees C. to 400 degrees C.

(Configuration of Power Module)

Figure 16:
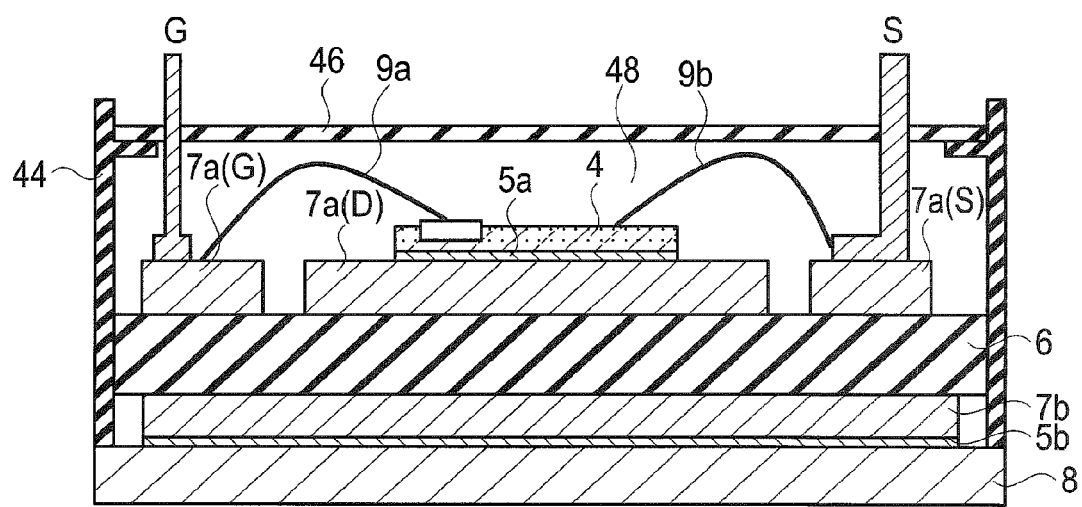
FIG. 16 shows an example of a configuration of module of the semiconductor device according to the first embodiment of the present invention.

As shown in FIG. 16, an example of a configuration of module of the semiconductor device 10 fabricated by applying the high melting point soldering layer according to the first embodiment includes: the base plate 8; the insulating substrate 6 disposed on the base plate 8 via the second high melting point soldering layer 5b and the second conducting metal layer 7b; and the semiconductor device 4 disposed on the insulating substrate 6 via the first conducting metal layer 7a and the first high melting point soldering layer 5a.

The first conducting metal layer 7a disposed on the insulating substrate 6 is divided into three parts as shown in FIG. 16. The first conducting metal layer 7a(G) is connected to a gate electrode of the semiconductor device 4 via a bonding wire 9a, and is connected to a gate lead G. The first conducting metal layer 7a(D) is connected to a drain electrode of the semiconductor device 4 via the first high melting point soldering layer 5a, and is connected to a drain lead D (not shown).

The first conducting metal layer 7a(S) is connected to a source electrode of the semiconductor device 4 via a bonding wire 9b, and is connected to a source lead S.

The semiconductor device 10 is surrounded with a frame 44, and hollow closure is performed by a sealing plate 46. Nitrogen gas, gaseous argon, etc. are enclosed with a hollow part 48.

Figure 17:
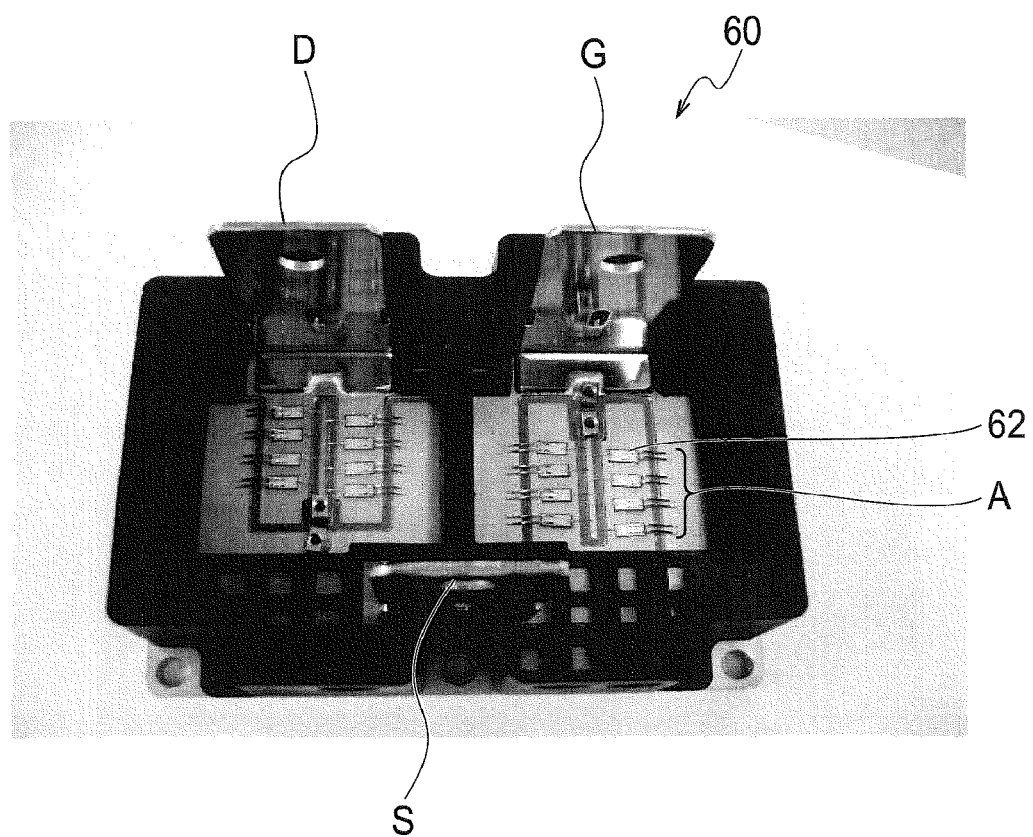
FIG. 17 shows a surface photograph of a power module assembled by using the semiconductor device according to the first embodiment of the present invention.

FIG. 17 shows an example of the surface photograph of a semiconductor power module 60 assembled by using the semiconductor device 10 fabricated by applying the high melting point soldering layer according to the first embodiment. The configuration of FIG. 17 corresponds to a configuration disposing in parallel the configuration of module of the semiconductor device 10 shown in FIG. 16, as shown in A in FIG. 17. In the example of FIG. 17, the configuration of module of the semiconductor device 10 shown in FIG. 16 is disposed by 16 pieces in parallel. A TLP attachment unit 62 is formed in the 16 semiconductor devices 10, respectively.

MODIFIED EXAMPLE

Figures 18A, 18B:
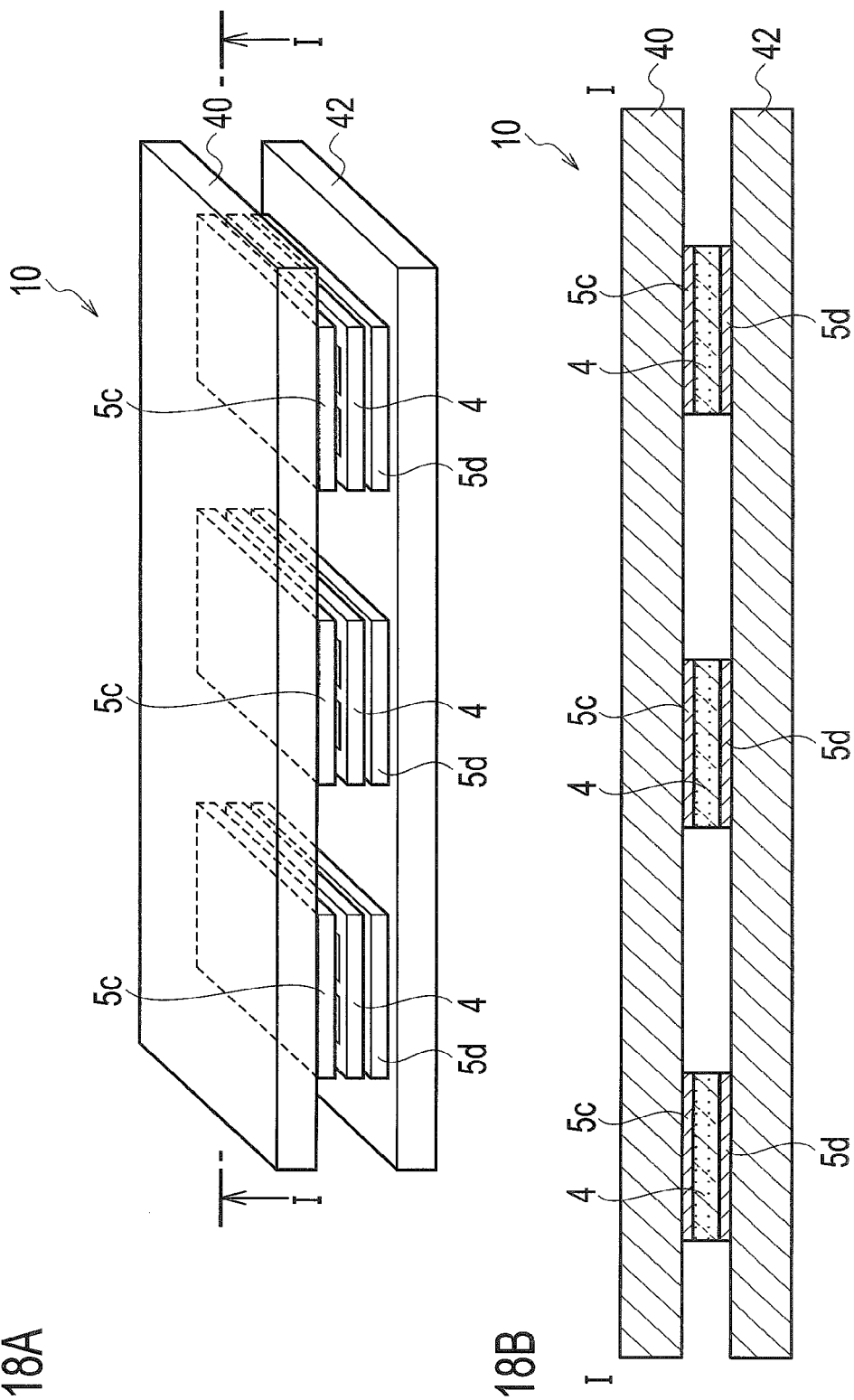
FIG. 18A is a schematic bird's-eye view of a semiconductor device according to a modified example of the first embodiment of the present invention.
FIG. 18B is a schematic cross-sectional configuration diagram taken in the line I-I of FIG. 18A.

A schematic bird's-eye view configuration of a semiconductor device 10 according to a modified example of the first embodiment is expressed as shown in FIG. 18A, and a schematic cross-section structure taken in the line I-I of FIG. 18A is expressed as shown in FIG. 18B. In the semiconductor device 10 according to the modified example of the first embodiment shown in FIG. 18, three semiconductor devices are connected in parallel.

As shown in FIG. 18A and FIG. 18B, the semiconductor device 10 according to the modified example of the first embodiment includes: a semiconductor device 4; a third high melting point soldering layer 5c disposed on the semiconductor device 4; a source side pad electrode 40 disposed on the third high melting point soldering layer 5c; a fourth high melting point soldering layer 5d disposed at the back side of the semiconductor device 4 of the opposite side of the surface where the third high melting point soldering layer 5c is disposed; and a drain side pad electrode 42 disposed at the back side of the fourth high melting point soldering layer 5d of the opposite side of the surface of the fourth high melting point soldering layer 5d where the semiconductor device 4 is disposed.

The third high melting point soldering layer 5c bonds the source electrode and the source side pad electrode 40 of the semiconductor device 4 by the TLP bonding, and the fourth high melting point soldering layer 5d bonds the drain electrode and the drain side pad electrode 42 of the semiconductor device 4 by the TLP bonding.

Since the configuration and the fabrication method of the third high melting point soldering layer 5c and the fourth high melting point soldering layer 5d are the same as the configuration and the fabrication method of the first high melting point soldering layer 5a or the second high melting point soldering layer 5b according to the first embodiment, the duplicating explanation is omitted.

According to the semiconductor device 10 of the modified example of the first embodiment, it can be made high current capacity by applying the high melting point soldering layer having the heat resistance of 480 degrees C. to the plurality of semiconductor devices 4 directly and connecting the semiconductor devices 4 in parallel, and it can be performed excellent heat radiation characteristics by configuring the double-sided cooling structure. Accordingly, the semiconductor power module with high efficiency electrically and thermally can be fabricated by applying the semiconductor device 10 according to the modified example of the first embodiment to the semiconductor power module.

Figure 19:
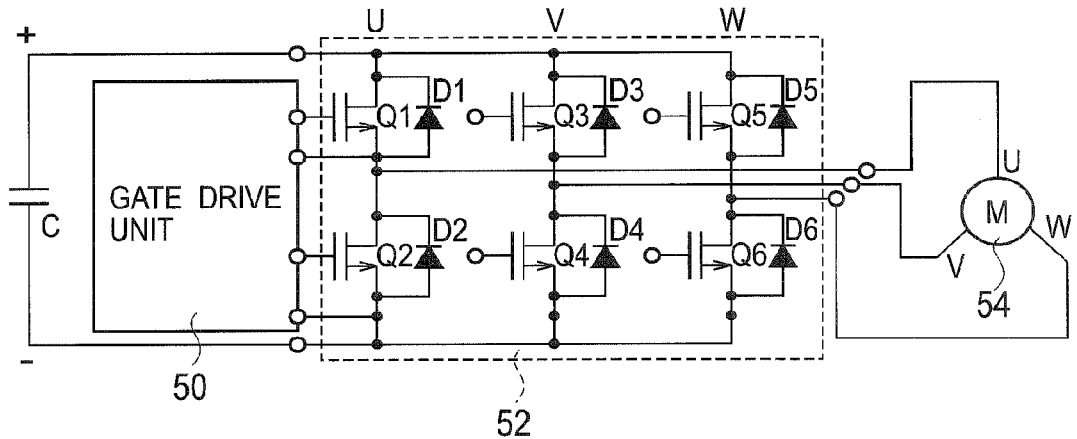
FIG. 19 is a schematic circuit configuration diagram of a three phase inverter circuit composed by using the semiconductor device according to the first embodiment of the present invention.

As shown in FIG. 19, a schematic circuit configuration of a three phase inverter circuit composed using the semiconductor device 10 according to the first embodiment includes a gate drive unit 50, a power module unit 52 connected to the gate drive unit 50, and a three-phase motor unit 54. Inverters of U phase, V phase, and W phase are connected to the power module unit 52 corresponding to U phase, V phase, and W phase of the three-phase motor unit 54.

As for the power module unit 52, SiC-MOSFETs Q1 and Q2, Q3 and Q4, and Q5 and Q6 of an inverter configuration are connected between a positive terminal (+) and a negative terminal (−) to which the capacitor C is connected. Furthermore, diodes D1 to D6 are connected inversely in parallel between the source and the drain of SiC-MOSFETs Q1 to Q6, respectively.

The high melting point soldering layer 5 according to the first embodiment is formed in the drain electrode of SiC-MOSFETs Q1 to Q6 by the TLP bonding.

In addition, when applying the double side cooling structure of the semiconductor device 10 according to the modified example of the first embodiment, the high melting point soldering layer 5 is formed in the source electrode and drain electrode of SiC-MOSFETs Q1 to Q6 by the TLP bonding.

Figure 20:
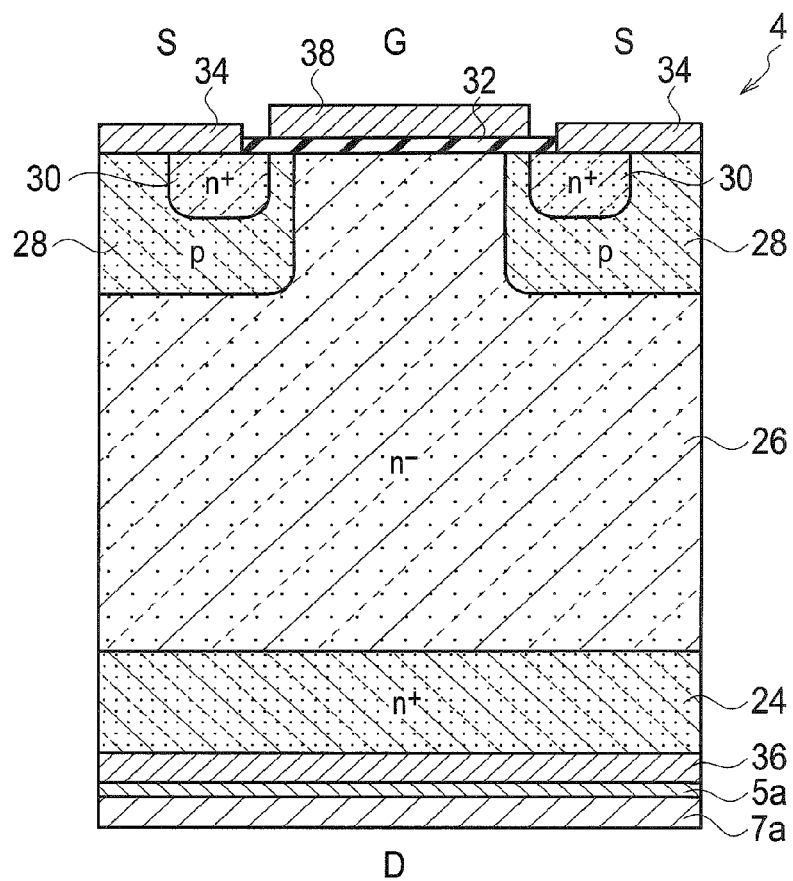
FIG. 20 shows an example of a semiconductor device applying to the semiconductor device according to the first embodiment of the present invention, and is a schematic cross-sectional configuration diagram of SiC-MOSFET.

As an example of the semiconductor device 4 applied to the semiconductor device 10 according to the first embodiment, as shown in FIG. 20, a schematic cross-section structure of SiC-MOSFET includes: an n⁻high-resistivity substrate 26; p base regions 28 formed in the surface side of the n⁻high-resistivity substrate 26; source regions 30 formed in the surface of the p base regions 28; a gate insulating film 32 disposed on the surface of the n⁻high-resistivity substrate 26 between the p base regions 28, a gate electrode 38 disposed on the gate insulating film 32; source electrodes 34 connected to the source regions 30; an n⁺ drain region 24 disposed at the back side of the opposite side of the surface of the n⁻high-resistivity substrate 26; and a drain electrode 36 connected to the n⁺ drain region 24.

As shown in FIG. 20, the drain electrode 36 is connected to the first conducting metal layer 7a via the first high melting point soldering layer 5a. The first high melting point soldering layer 5a is connected to the drain electrode 36 by the TLP bonding.

In addition, as the semiconductor device to which the first high melting point soldering layer 5a according to the first embodiment is applied, GaNFET etc. are also applicable instead of the SiC-MOSFET.

Furthermore, as the semiconductor device to which the first high melting point soldering layer 5a according to the first embodiment is applied, a semiconductor whose bandgap energy is about 1.1 eV to about 8 eV can be used.

According to the high melting point soldering layer according to the first embodiment, since there is heat resistance to 480 degrees C., the power devices, such as SiC and GaN, can be driven at high temperature by applying the high melting point soldering layer to the power device using SiC, GaN, etc.

According to the high melting point soldering layer according to the first embodiment, the electrical conductivity and the thermal conductivity can be made higher than the low melting point soldering layer. Accordingly, the semiconductor power module with high efficiency electrically and thermally can be fabricated by applying the high melting point soldering layer according to the first embodiment to the semiconductor power module.

According to the high melting point soldering layer according to the first embodiment, power loss can be suppressed because the electrical conductivity becomes high, and power conversion efficiency can be increased.

Moreover, the heat dissipation can become easy because the thermal conductivity becomes high, the improved performance, such as the weight saving of a heat sink, the control of the thermal run away of the semiconductor device, high frequency characteristics and power consumption efficiency, can be achieved, and the power conversion efficiency can be increased as a result.

According to the high melting point soldering layer according to the first embodiment, and the fabrication method for the same, since the TLP bonding of the high melting point can be formed according to the low temperature processing, the damage to the semiconductor device and its component can be decreased at the time of formation of the high melting point soldering layer.

According to the present invention, the binary based high melting point soldering layer having the TLP bonding of the high melting point, and the fabrication method for the same can be provided according to the low temperature processing.

Moreover, according to the present invention, the semiconductor device to which the high melting point soldering layer is applied can be provided.

According to the present invention, high temperature operation and stability can be obtained at lower processing temperatures. In particular, stability over a wide temperature range can be obtained. Temperature range can be increased with increased silver content and appropriate thermal profile.

Utilization of TLP concepts can drive reaction with commonly available components and alloys.

According to the present invention, lead-free composition necessary for ROHS compliance can be achieved.

According to the present invention, no gold in the metallization system can be achieved.

According to the present invention, potential for low thermal resistance as compared with traditional solutions can be achieved.

According to the present invention, utilization of standard tolerance and as received materials can be provided with no additional machining, planarization, or exotic materials to be tailored to device metallization thickness to remove device level post processing.

[Other Embodiments]

While the present invention is described in accordance with the aforementioned first embodiment and modified example of the first embodiment, it should be understood that the description and drawings that configure part of this disclosure are not intended to limit the present invention. This disclosure makes clear a variety of alternative embodiments, working examples, and operational techniques for those skilled in the art.

Such being the case, the present invention covers a variety of embodiments, whether described or not.

Industrial Applicability

The semiconductor device to which the high melting point soldering layer of the present invention is applied is available in whole power devices, such as a power semiconductor module and an intelligent power module for hybrid vehicles, extreme environment electronics, defense and space electronics: volumetrically constrained, high power density, ride-through capabilities, and low cooling system allowances, distributed energy: areas of high power density and low cooling system allowances

REFERENCE SIGNS LIST 1a, 12a: First high melting point metal layer;
1b, 12b: Second high melting point metal layer;
2a: First low melting point adhesive layer;
2b: Second low melting point adhesive layer;
2c: Third low melting point adhesive layer;
2d: Fourth low melting point adhesive layer;
3, 14: Low melting point metal layer;
4: Semiconductor device;
5: High melting point soldering layer;
5a: First high melting point soldering layer;
5b: Second high melting point soldering layer;
5c: Third high melting point soldering layer;
6: Insulating substrate;
7a: First conducting metal layer;
7b: Second conducting metal layer;
8: Base plate;
9a, 9b: Bonding wire;
10: Semiconductor device;
18: Weight;
20: Reflow machine;
22a: First barrier metal layer;
22b: Second barrier metal layer;
24: Drain region;
26: High-resistivity substrate;
28: Base region;
30: Source/drain region;
32: Gate insulating film;
34: Source electrode;
36: Drain electrode;
38: Gate electrode;
40: Drain side pad electrode;
42: Source side pad electrode;
44: Frame;
46: Sealing plate;
50: Gate drive unit;
52: Power module unit;
54: Three-phase motor unit;
60: Semiconductor power module;
62: TLP attachment unit;
S: Source lead;
G: Gate lead; and
D: Drain lead.

The invention claimed is:

1. A high melting point soldering layer comprising:
a low melting point metal layer;
a first high melting point metal layer disposed on a surface of the low melting point metal layer; and
a second high melting point metal layer disposed at a back side of the low melting point metal layer, wherein
the low melting point metal layer, the first high melting point metal layer, and the second high melting point metal layer are subjected to pre-treatment, and
subsequently the low melting point metal layer, the first high melting point metal layer, and the second high melting point metal layer are mutually alloyed by liquid phase diffusion bonding, wherein
the low melting point metal layer is formed of one of an Sn layer and an Sn—Ag eutectic solder layer, the first high melting point metal layer is formed of an Ag layer, and the second high melting point metal layer is formed of one of an Ag layer and an Ni layer.

2. The high melting point soldering layer according to claim 1, wherein
the Sn—Ag eutectic solder layer is composed of composition of 96.5±1% of Sn, and 3.5±1% of Ag.

3. The high melting point soldering layer according to claim 1, wherein
a temperature at the time of forming the liquid phase diffusion bonding is not less than 250 degrees C. and not more than 480 degrees C.

4. The high melting point soldering layer according to claim 1 further comprising
a low melting point adhesive layer for covering the first high melting point metal layer and the second high melting point metal layer.

5. The high melting point soldering layer according to claim 4, wherein the low melting point adhesive layer is formed of an Sn layer.

6. A semiconductor device comprising:
an insulating substrate;
a first conducting metal layer disposed on the insulating substrate;
a first high melting point soldering layer disposed on the first conducting metal layer;
a semiconductor device disposed on the first high melting point soldering layer;
a second conducting metal layer disposed at a back side of the insulating substrate of an opposite side of a surface of the insulating substrate disposing the first conducting metal layer;
a second high melting point soldering layer disposed at a back side of the second conducting metal layer of an opposite side of a surface of the second conducting metal layer disposing the insulating substrate; and
a base plate disposed at a back side of the second high melting point soldering layer of an opposite side of a surface of the second high melting point soldering layer disposing the second conducting metal layer, wherein the second high melting point soldering layer is formed by the liquid phase diffusion bonding; and wherein each of the first high melting point soldering layer and the second high melting point soldering layers includes a low melting point metal layer, a first high melting point metal layer disposed on a surface of the low melting point metal layer, and a second high melting point metal layer disposed at a back side of the low melting point metal layer, and the low melting point metal layer, the first high melting point metal layer, and the second high melting point metal layer are mutually alloyed by the liquid phase diffusion bonding, wherein the low melting point metal layer, the first high melting point metal layer, and the second high melting point metal layer are subjected to pre-treatment, and subsequently the first high melting point soldering layer is formed by liquid phase diffusion bonding.

7. The semiconductor device according to claim 6, wherein the said semiconductor device uses a semiconductor, band-gap energy of the semiconductor is 1. 1 eV to 8.0 eV.

8. A semiconductor device comprising:

an insulating substrate;

a second conducting metal layer disposed on the insulating substrate;

a second high melting point soldering layer disposed on the second conducting metal layer; and a base plate disposed on the second high melting point soldering layer, wherein the second high melting point soldering layer includes a low melting point metal layer, a first high melting point metal layer disposed on a surface of the low melting point metal layer, and a second high melting point metal layer disposed at a back side of the low melting point metal layer, and the low melting point metal layer, the first high melting point metal layer, and the second hi h melting point metal layer are mutually alloyed by the liquid phase diffusion bonding, wherein the low melting point metal layer, the first high melting point metal layer, and the second high melting point metal layer are subjected to pre-treatment and, subsequently the second high melting point soldering layer is formed by liquid phase diffusion bonding.

9. The semiconductor device according to claim 8 further comprising:

a barrier metal layer disposed at upward and downward of the insulating substrate.

10. The semiconductor device according to claim 9, wherein the barrier metal layer includes one of an Ni layer and a Ti layer.

\* \* \* \* \*